United States Patent [19]

Cho et al.

[11] Patent Number: 4,920,280
[45] Date of Patent: Apr. 24, 1990

[54] BACK BIAS GENERATOR

[75] Inventors: Soo-In Cho, Suwon; Dong-Sun Min, Seoul, both of Rep. of Korea

[73] Assignee: Samsung Electronics Co., Ltd., Suwon, Rep. of Korea

[21] Appl. No.: 187,930

[22] Filed: Apr. 29, 1988

[30] Foreign Application Priority Data

Apr. 30, 1987 [KR] Rep. of Korea .................. 1987-4241

[51] Int. Cl.$^5$ .......................... H03L 1/00; H03K 3/01
[52] U.S. Cl. .............................. 307/296.2; 307/296.5; 307/443
[58] Field of Search .................. 307/296.2, 296.5, 304, 307/443

[56] References Cited

U.S. PATENT DOCUMENTS

| | | | |
|---|---|---|---|
| 4,307,307 | 12/1981 | Parekh | 307/297 |
| 4,433,253 | 2/1984 | Zapisek | 307/304 |
| 4,439,692 | 3/1984 | Beekmans et al. | 307/297 |
| 4,631,421 | 12/1986 | Inoue et al. | 307/297 |
| 4,794,278 | 12/1988 | Vajdic | 307/296 R |

OTHER PUBLICATIONS

"Substrate Voltage Regulator", IBM Technical Disclosure Bulletin, vol. 27, No. 2, Jul. 1984, B. Cassidy et al.

*Primary Examiner*—Stanley D. Miller
*Assistant Examiner*—Richard Roseen
*Attorney, Agent, or Firm*—Fleit, Jacobson, Cohn, Price, Holman & Stern

[57] ABSTRACT

A circuit for generating a back bias voltage for use in a semiconductor memory device is disclosed, wherein the back bias voltage is clamped within a desired voltage level. The circuit comprises an oscillator for generating a sequence of square waves having a specified frequency, a buffer adapted to be connected with the output of said oscillator and for buffering the output of said oscillator into the square waves having a level of a source supply voltage, a charge pump circuit for providing a back bias voltage by receiving the output of said buffer, and a clamping circuit adapted to be coupled in parallel between the output of said charge pump circuit and a ground level and for clamping within a specified range the back bias voltage being provided by said charge pump circuit in accordance with variations of said source supply voltage.

20 Claims, 1 Drawing Sheet

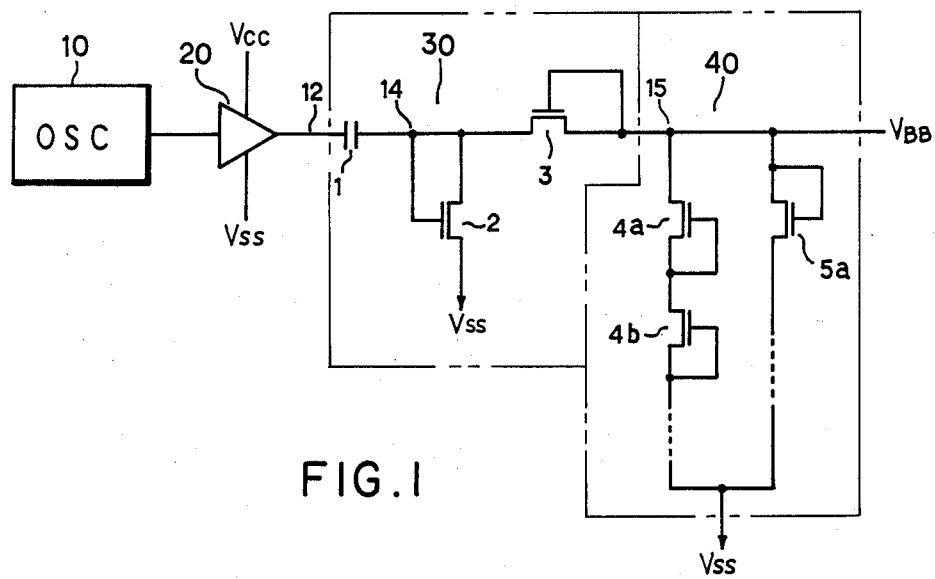
FIG.1
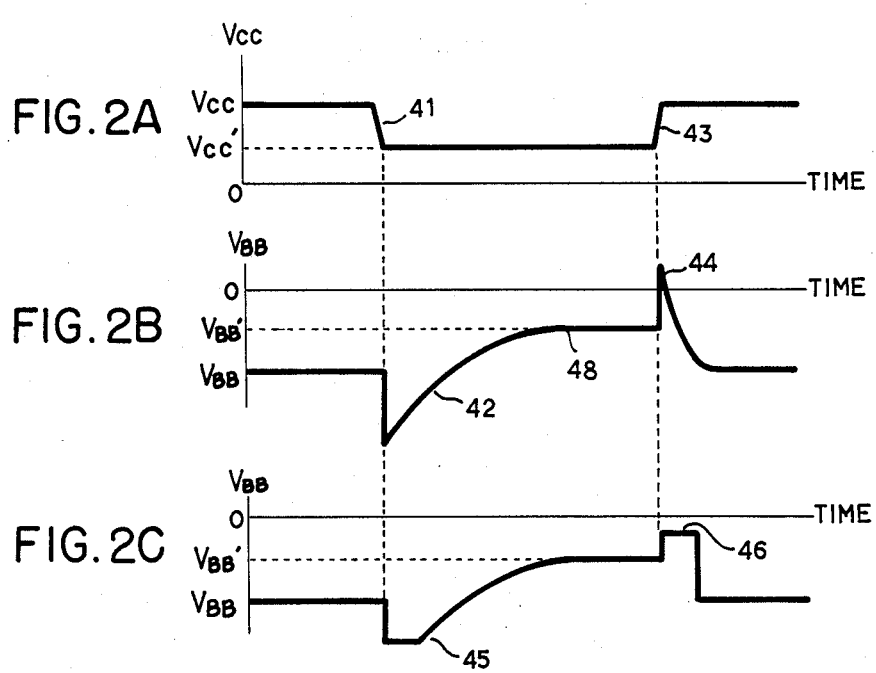
FIG.2A
FIG.2B
FIG.2C

BACK BIAS GENERATOR

FIELD OF THE INVENTION

The invention relates to a circuit of a semiconductor memory device, and in particular to an improved circuit for generating a back bias voltage for use in a semiconductor memory device.

BACKGROUND OF THE INVENTION

A recent semiconductor memory device has been equipped with an on-chip back bias generator in order to improve its performance and reduce the number of its exterior pins. The performance of semiconductor memory device formed in a P-type semiconductor substrate can be improved by the application of the negative voltage (usually less than −2 volts) to the semiconductor substrate, whereby the threshold voltage of a n-channel MOS transistor formed in the substrate can be stabilized, and not only an increase in operating speed but also a reduction of leakage current can be achieved due to the decrease of the junction capacitance.

However, the aforementioned improvement of performance will be secured only in the case where the variation of power supply voltage provides the back bias voltage controlled within a desired value. As a matter of fact, the power supply voltage delivered from the exterior power supply circuit of the semiconductor memory device instantaneously varies due to the unstable operation thereof and the introduction of noise. Accordingly, by the variation of such power supply voltage, the back bias generator exerts a vital influence on the on-chip semiconductor circuit. That is, when the back bias voltage falls in a large amount due to the variation of the power supply voltage, the reverse bias voltage at N+/P junction regions in the substrate will increase to easily cause a reverse breakdown. Also, when the back bias voltage rises over the ground level voltage, the junction regions will be forwardly biased and, as a result, a semiconductor memory device will cause the malfunction as a whole.

STATEMENT OF THE INVENTION

It is therefore an object of the invention to provide an improved back bias generator. It is another object to provide a back bias generator which enables the back bias voltage to be clamped within a desired voltage level.

To achieve these and other objects of the invention, the circuit comprises an oscillator for generating a sequence of square waves having a specified frequency, a buffer adapted to be connected with the output of said oscillator and for buffering the output of said oscillator into the square waves having a level of a source supply voltage, a charge pump circuit for providing a back bias voltage by receiving the output of said buffer, and a clamping circuit adapted to be coupled in parallel between the output of said charge pump circuit and a ground level for clamping within a specified range the back bias voltage being provided by said charge pump circuit in accordance with variations of said source supply voltage.

BRIEF DESCRIPTION OF THE DRAWINGS

This and other aspects of the invention will be better understood by careful review of the Detailed Description of the Invention, infra, taken together with the drawings, in which:

FIG. 1 is a schematic circuit diagram of a back bias voltage generator according to the invention: and FIGS. 2A to 2C are diagrams of waveforms in essential portions of the circuit shown in FIG. 1.

DETAILED DESCRIPTION OF THE PREFERRED EMBODIMENT OF THE INVENTION

A back bias voltage generator of FIG. 1 according to the invention includes an oscillator 10 having a ring oscillator with conventional inverters or a Schmitt trigger circuit and gates for generating a square wave, a buffer circuit 20 for buffering the square wave output of said oscillator 10 into the square wave having an amplitude between a source supply voltage Vcc and a ground voltage Vss by receiving the output of said oscillator, a charge pump circuit 30 having a capacitor 1 and MOS transistors 2 and 3 for providing a back bias voltage by receiving the output of said buffer circuit, and a clamping circuit 40 having MOS transistors (4a, 4b, ..., and 5a ...) for receiving the output of said charge pump circuit and also clamping out an over-range portion and an under-range portion of the variation of said back bias voltage according to the variation of said source supply voltage Vcc.

The frequency of said square wave output of the above oscillator 10 is generally of 3 to 12 MHz and the duty cycle thereof is used as "1". It is also used for the charge pump circuit 30 a MOS capacitor 1 having a large capacitance, one electrode of which is connected to an output of said buffer circuit 20 and other electrode of the same is connected to a node 14. To the node 14 are connected a drain and a gate of a N-type MOS transistor 2, and to a ground voltage Vss (for example, zero volt) is connected a source of the same transistor. Clamping circuit 40 includes MOS transistor 4a, 4b, ... and 5a, .... A node 15 is connected to a gate of a N-type MOS transistor 3 and its drain-source path is connected in series between the nodes 14 and 15. MOS transistors 4a, 4b, ... with their gates and sources respectively coupled, are connected in series between node 15 and the ground voltage Vss, and MOS transistors 5a, ... with their drains and gates respectively coupled, are also connected in parallel with said transistors 4a,4b ... between node 15 and voltage Vss.

Hereinafter, the operation of the back bias voltage generator of FIG. 1 will be described in detail. The square wave output of the oscillator 10 is made into a square wave having a level of source supply voltage Vcc and the ground voltage Vss through buffer circuit 20. MOS capacitor 1 receives the square wave through an output line 12. The input terminal of MOS capacitor 1 may be so that the source and drain are coupled in common, in which configuration the output terminal of MOS capacitor 1 becomes the gate electrode and is connected to the node 14. Now, assuming that the square wave delivered to the input terminal of the capacitor 1 is on its rising edge, voltage Vcc charges capacitor 1 and the transistor 2 is in an ON state. Then, if the falling edge of the square wave is delivered to the input of capacitor 1 through the line 12, the voltage on node 14 through the output line of capacitor 1 goes to a negative level and transistor 2 goes to an OFF state. At this time, if the voltage of node 15 connected to the gate of the transistor 3 becomes higher than the negative voltage of the node 14 by the threshold voltage of transistor 3, transistors 3 turns ON. Thus the negative charge is transferred from the node 14 to the node 15 through the transistor 3 and a back bias voltage $V_{BB}$ goes to a negative level. However, if the voltage of the node 14 becomes higher than that of the node 15 by the threshold voltage, the transistor 3 turns OFF. Thus the back bias voltage output of node 15 reverts to the original back bias voltage, thereby providing a stable back bias voltage to a semiconductor substrate.

Referring now to FIG. 2A, when the source supply voltage Vcc suddenly falls to a lower voltage Vcc', the voltage of the node 14 in the falling edge 41 goes down further to a negative level and the transistor 3 then turns ON. Thus the back bias voltage of the output node 15 goes down further to a negative level like a negative spike waveform 42 shown in FIG. 2B. FIG. 2B shows Voltage $V_{BB}$ at node 15 without the clamp circuit while FIG. 2C shows voltage $V_{BB}$ with the clamp circuit. When the source supply voltage becomes stabilized to voltage $V_{cc}$ as shown in FIG. 2A, the back bias voltage also becomes stabilized to the voltage $V_{BB}$ as shown in a waveform portion 48 of FIG. 2B. That is, the back bias voltage goes up by the amount of falling in the source supply voltage and becomes stable therein. Then, when the source supply voltage again returns to the voltage level Vcc, the back bias voltage temporarily goes up as shown in the spike 44 of FIG. 2B and again comes back to voltage level $V_{BB}$. Therefore, the voltage of the node 15 as shown in FIG. 2B is clamped like a waveform portion 45 of FIG. 2C, through a series of transistors 4a, 4b, ... between the node 15 and the ground voltage Vss. Therein, assuming that the threshold voltage of transistors 4a, 4b... is $V_T$ and the number of transistors in series connection is K, the clamping voltage amounts to a value $KV_T$.

Meanwhile, and transistors 5a, ... connected in series between said node 15 and ground voltage Vss are used to prevent the voltage level $V_{BB}$ from going up over a fixed range, as shown in a waveform portion 46 of FIG. 2C. Thus, though the source supply voltage varies, the back bias voltage is always provided with clamping to a fixed range. As the back bias voltage generator according to the invention prevents a reverse breakdown due to a negative spike voltage signal 42 and forward breakdown due to a positive spike voltage signal 44 in a junction surface of a semiconductor memory device, it and becomes possible to provide stable operation.

While the invention has been particularly shown and described herein with reference to a preferred embodiment thereof, it will be understood by those skilled in the art that various other modification and changes may be made to the present invention from the principles of the invention described above without departing from the spirit and scope thereof as encompassed in the accompanying claims. Therefore, it is intended in the appended claims to cover all such equivalent variations as may come within the scope of the invention as described.

What is claimed is:

1. A circuit for generating a back bias voltage, to be equipped within a semiconductor memory device having a semiconductor substrate, and for providing said back bias voltage to the semiconductor substrate, said circuit comprising:
   oscillator means for generating as a first output, a sequence of square waves having a specified frequency;
   buffer means connectable to receive the output of said oscillator, for buffering the output of said oscillator means into a second output, square waves having an amplitude within a first range;
   charge pump circuit means for receiving the output of said buffer means and for providing as a third output, a back bias voltage; and
   clamping circuit means connectable between the output of said charge pump circuit means and a reference potential, for clamping with a specified range the back bias voltage being provided by said charge pump circuit in accordance with variations of a source supply voltage.

2. The circuit of claim 1, wherein said oscillator means, buffer means, charge pump circuit means and clamping circuit means form part of a monolithic integrated circuit.

3. The circuit of claim 1, wherein said clamping circuit means comprises:
   a first plurality of serially coupled transistors having source to drain channels of successive ones of said first plurality of transistors serially coupled together with gate and source electrodes of each of said first plurality of transistors coupled together;
   a second plurality of serially coupled transistors having source to drain channels of successive ones of said second plurality of transistors serially coupled together with gate and drain electrodes of each of said second plurality of transistors coupled together; and
   said first plurality of serially coupled transistors being connected in parallel with said second plurality of serially coupled transistors.

4. The circuit of claim 2, wherein said clamping circuit means comprises:
   a first plurality of serially coupled transistors having source to drain channels of successive ones of said first plurality of transistors serially coupled together with gate and source electrodes of each of said first plurality of transistors coupled together;
   a second plurality of serially coupled transistors having source to drain channels of successive ones of said second plurality of transistors serially coupled together with gate and drain electrodes of each of said second plurality of transistors coupled together; and
   said first plurality of serially coupled transistors being connected in parallel with said second plurality of serially coupled transistors.

5. The circuit of claim 1, wherein said charge pump circuit comprises:
   a MOS capacitor coupled between said buffer means and a first node;
   a first transistor having a control electrode coupled to said first node with conduction path electrodes coupled between said first node and said reference potential; and
   a second transistor having a gate electrode coupled to said clamping circuit with conduction path electrodes coupled between said first node and said clamping circuit.

6. The circuit of claim 3, wherein said charge pump circuit comprises:
   a MOS capacitor coupled between said buffer and a first node;
   a first transistor having a control electrode coupled to said first node with conduction path electrodes coupled between said first node and said reference potential; and a second transistor having a gate electrode coupled to said first and second plurality of transistors with conduction electrodes of said second transistor coupled between said first node and said first and second plurality of transistors.

7. The circuit of claim 4, wherein said charge pump circuit comprises:
 a MOS capacitor coupled between said buffer and a first node;
 a first transistor having a control electrode coupled to said first node with conduction path electrodes coupled between said first node and said reference potential; and
 a second transistor having a gate electrode coupled to said first and second plurality of transistors with conduction electrodes of said second transistor coupled between said first node and said first and second plurality of transistors.

8. A circuit for providing back bias voltage to a semiconductor substrate, said circuit comprising:
 charge pump circuit means for receiving a sequence of square waves exhibiting a frequency and varying amplitude, for providing at an output terminal a back bias voltage; and
 clamping circuit means connectable between the output terminal and a second terminal connectable to a reference source, for clamping within a range between two reference potentials the back bias voltage provided by said charge pump circuit.

9. The circuit of claim 8, wherein said charge pump circuit means and clamping circuit means form part of a monolithic integrated circuit.

10. The circuit of claim 8, wherein said clamping circuit means comprises:
 a first plurality of serially coupled transistors having source to drain channels of successive ones of said first plurality of transistors serially coupled together and having corresponding gate and source electrodes of each of said first plurality of transistors connected;
 a second plurality of serially coupled transistors having source to drain channels of successive ones of said second plurality of transistors serially coupled together and having corresponding gate and drain electrodes of each of said second plurality of transistors connected; and
 said first plurality of serially coupled transistors being connected in parallel with said second plurality of serially coupled transistors.

11. The circuit of claim 9, wherein said clamping circuit means comprises:
 a first plurality of serially coupled transistors having source to drain channels of successive ones of said first plurality of transistors serially coupled together and having corresponding gate and source electrodes of each of said first plurality of transistors connected;
 a second plurality of serially coupled transistors having source to drain channels of successive ones of said second plurality of transistors serially coupled together and having corresponding gate and drain electrodes of each of said second plurality of transistors connected; and
 said first plurality of serially coupled transistors being connected in parallel with said second plurality of serially coupled transistors.

12. The circuit of claim 8, wherein said charge pump circuit comprises:
 a MOS capacitor coupled between said buffer means and a first node;
 a first transistor having a control electrode coupled to said first node with conduction path electrodes coupled between said first node and said reference potential; and
 a second transistor having a gate electrode coupled to said clamping circuit with conduction path electrodes coupled between said first node and said clamping circuit.

13. The circuit of claim 10, wherein said charge pump circuit comprises:
 a MOS capacitor coupled between said buffer and a first node;
 a first transistor having a control electrode coupled to said first node with conduction path electrodes coupled between said first node and said reference source; and
 a second transistor having a gate electrode coupled to said first and second plurality of transistors with conduction electrodes of said second transistor coupled between said first node and said first and second plurality of transistors.

14. The circuit of claim 11, wherein said charge pump circuit comprises:
 a MOS capacitor coupled between said buffer and a first node;
 a first transistor having a control electrode coupled to said first node with conduction path electrodes coupled between said first node and said reference source; and
 a second transistor having a gate electrode coupled to said first and second plurality of transistors with conduction electrodes of said second transistor coupled between said first node and said first and second plurality of transistors.

15. A circuit, comprising:
 a capacitor coupled between an input terminal and a first node;
 a first transistor having a control electrode coupled to said first node with channel electrodes coupled between said first node and a first reference potential;
 a second transistor having a control electrode coupled to an output terminal and having channel electrodes coupled between said first node and said output terminal;
 a first stage including a third transistor having channel electrodes connected between said output terminal and said first reference potential, and having a control electrode connected to said first reference potential;
 a second stage including a fourth transistor having channel electrodes connected between said output terminal and said first reference potential, and having a control electrode coupled to said output terminal; and
 said capacitor, first, second, third and fourth transistors forming part of a monolithic integrated circuit.

16. The circuit of claim 15, further comprising means for providing to said input terminal a square wave exhibiting a frequency and amplitude varying within a range between a first reference potential and a second potential.

17. The circuit of claim 15, wherein said third transistor comprises one of a first plurality of transistors each having a control electrode, a channel and a first channel electrode separated by the channel from said first node, with corresponding control electrode and first channel electrode of each of said first plurality of transistors coupled together.

18. The circuit of claim 15, wherein said fourth transistor comprises one of a first plurality of transistors each having a control electrode, a channel and a first channel electrode separated by the channel from said first reference potential, with corresponding control electrode and first channel electrode of each of said first plurality of transistors coupled together.

19. The circuit of claim 17, wherein said fourth transistor comprises one of a second plurality of transistors each having a control electrode, a channel and a first channel electrode separated by the channel from said first reference potential, with corresponding control electrode and first channel electrode of each of said second plurality of transistors coupled together.

20. The circuit of claim 16, wherein:
said third transistor comprises one of a first plurality of transistors each having a control electrode, a channel and a first channel electrode separated by the channel from said first node, with corresponding control electrode and first channel electrode of each of said first plurality of transistors coupled together; and
said fourth transistor comprises one of a second plurality of transistors each having a control electrode, a channel and a first channel electrode separated by the channel from said first reference potential, with corresponding control electrode and first channel electrode of each of said second plurality of transistors coupled together.

* * * * *